(12) United States Patent
Son et al.

(10) Patent No.: US 11,733,315 B2
(45) Date of Patent: Aug. 22, 2023

(54) APPARATUS FOR DETECTING STACKING DIRECTION OF INTERNAL ELECTRODE OF MULTILAYER CAPACITOR AND DETECTING METHOD THEREOF

(71) Applicant: SAMSUNG ELECTRO-MECHANICS CO., LTD., Suwon-si (KR)

(72) Inventors: Soo Hwan Son, Suwon-si (KR); Se Hun Park, Suwon-si (KR); Byeong Cheol Moon, Suwon-si (KR); Young Ghyu Ahn, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/745,207

(22) Filed: May 16, 2022

(65) Prior Publication Data
US 2023/0108548 A1 Apr. 6, 2023

(30) Foreign Application Priority Data

Oct. 6, 2021 (KR) .......................... 10-2021-0132444

(51) Int. Cl.
| | |
|---|---|
| G01R 27/28 | (2006.01) |
| G01R 31/64 | (2020.01) |
| G01R 27/26 | (2006.01) |
| H01G 4/30 | (2006.01) |

(52) U.S. Cl.
CPC .......... *G01R 31/64* (2020.01); *G01R 27/2611* (2013.01); *H01G 4/30* (2013.01)

(58) Field of Classification Search
CPC ...... G01R 31/64; G01R 31/016; G01R 27/02; G01R 27/2611; G01R 19/16571; H01F 17/0013; H01G 4/30; H01G 4/232
See application file for complete search history.

(56) References Cited

U.S. PATENT DOCUMENTS

| | | | | |
|---|---|---|---|---|
| 2014/0182101 | A1* | 7/2014 | Sasaoka | G01R 33/12 29/25.41 |
| 2015/0196936 | A1* | 7/2015 | Sasaoka | H01G 13/00 209/555 |
| 2015/0377833 | A1* | 12/2015 | Hayashi | G01N 27/72 324/228 |

FOREIGN PATENT DOCUMENTS

| | | |
|---|---|---|
| JP | 6107752 B2 | 4/2017 |
| JP | 6361570 B2 | 7/2018 |
| KR | 10-2018-0061001 A | 6/2018 |

* cited by examiner

*Primary Examiner* — Thang X Le
(74) *Attorney, Agent, or Firm* — Morgan, Lewis & Bockius LLP (57) ABSTRACT

An apparatus for detecting a stacking direction of internal electrodes of a multilayer capacitor includes a capacitor moving unit having a supply unit in which a plurality of multilayer capacitors are continuously supplied ad moving the supplied multilayer capacitors in one direction, a sensor unit including a coil, installed on the capacitor moving unit, and detecting inductance of the coil when each of the multilayer capacitors approaches the coil to determine a stacking direction of internal electrodes of the multilayer capacitor based on the detected inductance of the coil, and a separating unit installed on the capacitor moving unit and separating a multilayer capacitor selected as an unsuitable multilayer capacitor by the sensor unit.

13 Claims, 5 Drawing Sheets

FIG. 6A  FIG. 6B

APPARATUS FOR DETECTING STACKING DIRECTION OF INTERNAL ELECTRODE OF MULTILAYER CAPACITOR AND DETECTING METHOD THEREOF

CROSS-REFERENCE TO RELATED APPLICATION

This application claims benefit of priority to Korean Patent Application No. 10-2021-0132444 filed on Oct. 6, 2021 in the Korean Intellectual Property Office, the disclosure of which is incorporated herein by reference in its entirety.

BACKGROUND

1. Technical Field

The present disclosure relates to an apparatus for detecting a stacking direction of internal electrodes of a multilayer capacitor and a detecting method thereof.

2. Description of Related Art

Multilayer capacitors (MLCCs) sometimes require alignment of a direction of electrodes when mounted on a PCB for customer requirements and product characteristics improvement.

In the related art, magnets are used to align the direction of the internal electrodes of multilayer capacitors before product packaging and sale to customers.

However, the method using magnets has a limit in terms of the accuracy of alignment, so there is a possibility that chips aligned in an unwanted direction may leak out.

SUMMARY

An aspect of the present disclosure may provide an apparatus and method for detecting a stacking direction of internal electrodes of a multilayer capacitor having improved accuracy.

According to an aspect of the present disclosure, an apparatus for detecting a stacking direction of internal electrodes of a multilayer capacitor includes: a capacitor moving unit having a supply unit in which a plurality of multilayer capacitors are continuously supplied and moving the supplied multilayer capacitors in one direction; a sensor unit including a coil, installed on the capacitor moving unit, and detecting inductance of the coil when each of the multilayer capacitors approaches the coil to determine a stacking direction of internal electrodes of the corresponding multilayer capacitor based on the detected inductance of the coil; and a separating unit installed on the capacitor moving unit and separating a multilayer capacitor selected as an unsuitable multilayer capacitor by the sensor unit.

The apparatus may further include: a magnetic member disposed in a position opposing the sensor unit with the corresponding multilayer capacitor interposed therebetween.

Magnetic permeability of the magnetic member may range from 100 to 5000.

The apparatus may further include: an interval maintaining member disposed between the sensor unit and the corresponding multilayer capacitor and disposed to be in contact with one surface of the multilayer capacitor, in which an interval between the sensor unit and the multilayer capacitor is uniform.

The interval maintaining member may include a non-magnetic material.

In the sensor unit, an inner diameter of the coil is 3.0 times or less of a length of the corresponding multilayer capacitor in a length direction, and the number of turns of the coil may satisfy Equation 1 below.

The number of turns $(N) \geq 20/$(length of multilayer capacitor×inner diameter of coil).    Equation 1

According to another aspect of the present disclosure, a method for detecting a stacking direction of internal electrodes of a multilayer capacitor includes: allowing a sensor unit including a coil to approach a multilayer capacitor to determine an inductance value of the coil according to a stacking direction of the internal electrodes included in the multilayer capacitor and comparing the determined inductance value with a preset reference inductance value to detect the stacking direction of the internal electrodes of the multilayer capacitor.

A measurement frequency of inductance may range from 50 kHz to 5 Mhz.

A magnetic member may be disposed in a position opposing the sensor unit with the multilayer capacitor interposed therebetween to increase a change in inductance of the coil generated by an eddy current.

An interval maintaining member including a non-magnetic material may be disposed between the sensor unit and the multilayer capacitor, and may be disposed to be in contact with one surface of the multilayer capacitor so that an interval between the sensor unit and the multilayer capacitor is uniformly maintained.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Hereinafter, in defining a direction of a multilayer capacitor to clearly describe an exemplary embodiment in the present disclosure, X, Y, and Z indicated in the drawings may be defined as a length direction, a width direction, and a thickness direction of the multilayer capacitor, respectively. Here, the length direction (e.g., X direction in FIG. 1 or FIG. 2) may be a direction in which two external electrodes of the multilayer capacitor oppose. The thickness direction (e.g., Z direction in FIG. 1 or FIG. 2) may be an axial direction of a coil 11 of a sensor unit 10 positioned above the multilayer capacitor. The width direction (e.g., Y direction in FIG. 1 or FIG. 2) may be a direction orthogonal to the length (X) and thickness (Z) directions.

As multilayer capacitors have been increasingly reduced in thickness, a technology capable of easily detecting a direction of internal electrodes included therein is more required.

The present disclosure relates to an apparatus for detecting a stacking direction of internal electrodes included in a multilayer capacitor and a method for detecting a stacking type of a multilayer capacitor using the apparatus.

A multilayer capacitor applied to an exemplary embodiment in the present disclosure is classified into a first multilayer capacitor and a second multilayer capacitor according to a stacking direction of internal electrodes, which will be described below.

Here, the first multilayer capacitor has a structure in which a plurality of internal electrodes are stacked in a direction, parallel to a mounting surface, and the second multilayer capacitor has a structure in which a plurality of internal electrodes are stacked in a direction perpendicular to a mounting surface.

Figure 1:
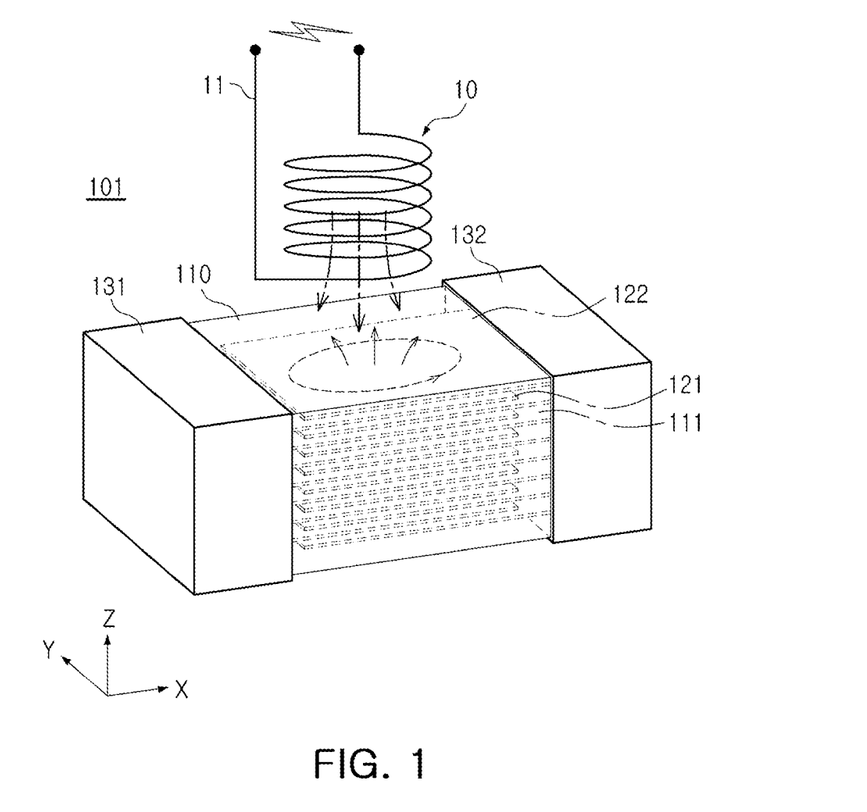
FIG. 1 is a perspective view schematically illustrating detection of a first multilayer capacitor by a sensor unit according to an exemplary embodiment in the present disclosure.
Figure 2:
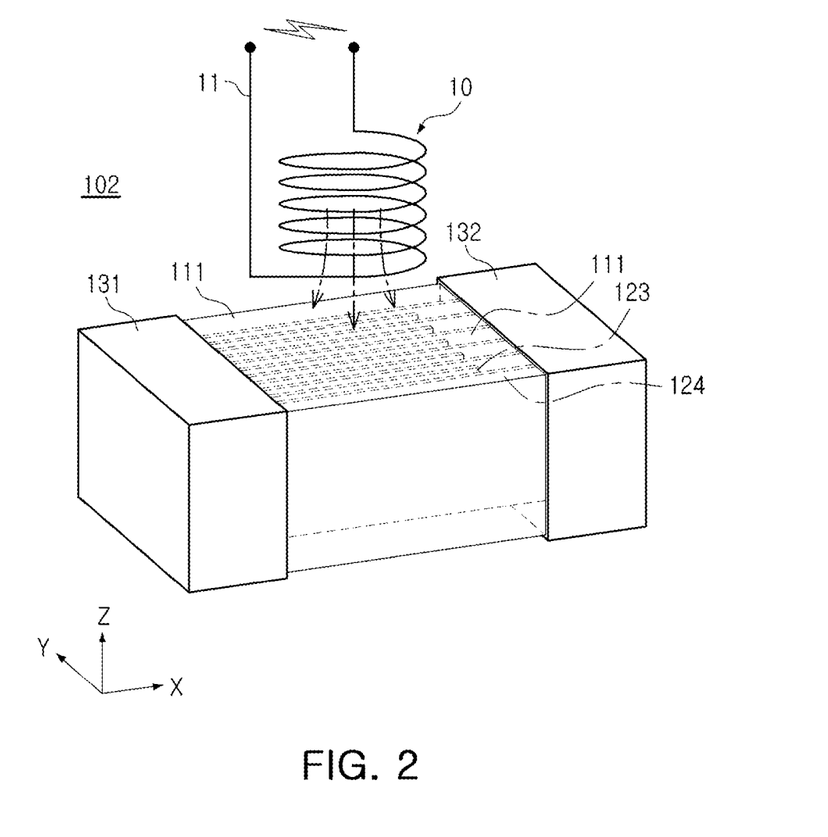
FIG. 2 is a perspective view schematically illustrating detection of a second multilayer capacitor by a sensor unit according to an exemplary embodiment in the present disclosure.

FIG. 1 is a perspective view schematically illustrating detection of a first multilayer capacitor by a sensor unit according to an exemplary embodiment in the present disclosure, and FIG. 2 is a perspective view schematically illustrating detection of a second multilayer capacitor by a sensor unit according to an exemplary embodiment in the present disclosure.

Referring to FIG. 1, a first multilayer capacitor 101 according to an exemplary embodiment includes a capacitor body 110 and first and second external electrodes 131 and 132.

The capacitor body 110 is formed by stacking a plurality of dielectric layers 111 in the Z direction and then firing, and adjacent dielectric layers 111 of the capacitor body 110 may be integrated such that boundaries therebetween may not be readily apparent without using a scanning electron microscope (SEM).

In this case, the capacitor body 110 may have a substantially hexahedral shape, but the present disclosure is not limited thereto. In addition, a shape and size of the capacitor body 110 and the number of stacked dielectric layers 111 are not limited to those shown in the drawings of this exemplary embodiment.

In the present exemplary embodiment, for convenience of description, both surfaces of the capacitor body 110 opposing each other in the Z direction are defined as first and second surfaces, both surfaces connected to the first and second surfaces perpendicular to the Z direction, opposing each other in the X direction are defined as third and fourth surfaces, and both surfaces connected to the first and second surfaces, connected to the third and fourth surfaces, and opposing each other in the Y direction perpendicular to the Z direction are defined as fifth and sixth surfaces.

Also, a mounting surface of the first multilayer capacitor 101 may be the first surface of the capacitor body 110.

The capacitor body 110 may include an active region including a dielectric layer 111 and first and second internal electrodes 121 and 122 and being a part contributing to capacitance formation of the capacitor and upper and lower cover regions disposed on upper and lower surfaces of the active region in the Z direction, respectively, as upper and lower margin portions.

The first and second internal electrodes 121 and 122 are electrodes to which different polarities are applied, and are alternately disposed in the Z direction with the dielectric layer 111 interposed therebetween, and one end of each of the first and second internal electrodes of the capacitor body 110 may be exposed through the third and fourth surfaces of the capacitor body 110.

In this case, the first and second internal electrodes 121 and 122 may be electrically insulated from each other by the dielectric layer 111 disposed therebetween.

Ends of the first and second internal electrodes 121 and 122 alternately exposed through the third and fourth surfaces of the capacitor body 110 may be electrically connected to the first and second external electrodes 131 and 132 disposed on the third and fourth surfaces of the capacitor body 110 to be described below, respectively.

According to the above configuration, when a predetermined voltage is applied to the first and second external electrodes 131 and 132, electric charges are accumulated between the first and second internal electrodes 121 and 122.

In this case, capacitance of the first multilayer capacitor 101 is proportional to an overlapping area of the first and second internal electrodes 121 and 122 overlapping each other in the Z-direction in the active region.

In addition, a material for forming the first and second internal electrodes 121 and 122 is not particularly limited, and for example, and the first and second internal electrodes 121 and 122 may be formed using a conductive paste including a noble metal material such as platinum (Pt), palladium (Pd), or palladium-silver (Pd—Ag) alloy, and one or more of nickel (N) and copper (Cu).

The first external electrode 131 is disposed at one end of the capacitor body 110 in the X direction.

In addition, the first external electrode 131 may include a first connection portion disposed on the third surface 3 of the capacitor body 110 and a first band portion extending toward portions of the first, second, fifth, and sixth surfaces of the capacitor body 110 from the first connection portion.

The second external electrode 132 is provided with a voltage having a polarity different from that of the first external electrode 131, and is disposed at the other end of the capacitor body 110 in the X direction.

In addition, the second external electrode 132 may include a second connection portion disposed on the fourth surface of the capacitor body 110 and a second band portion extending from the second connection portion toward portions of the first, second, fifth, and sixth surfaces of the capacitor body 110.

Referring to FIG. 2, in the second multilayer capacitor 102, the dielectric layer 111 and the first and second internal electrodes 123 and 124 are stacked in the Y direction. Excluding this, the other structure of the second multilayer capacitor 102 is similar to that of the first multilayer capacitor 101 of FIG. 1 described above, and thus a detailed description thereof will be omitted to avoid repetition.

Figure 3:
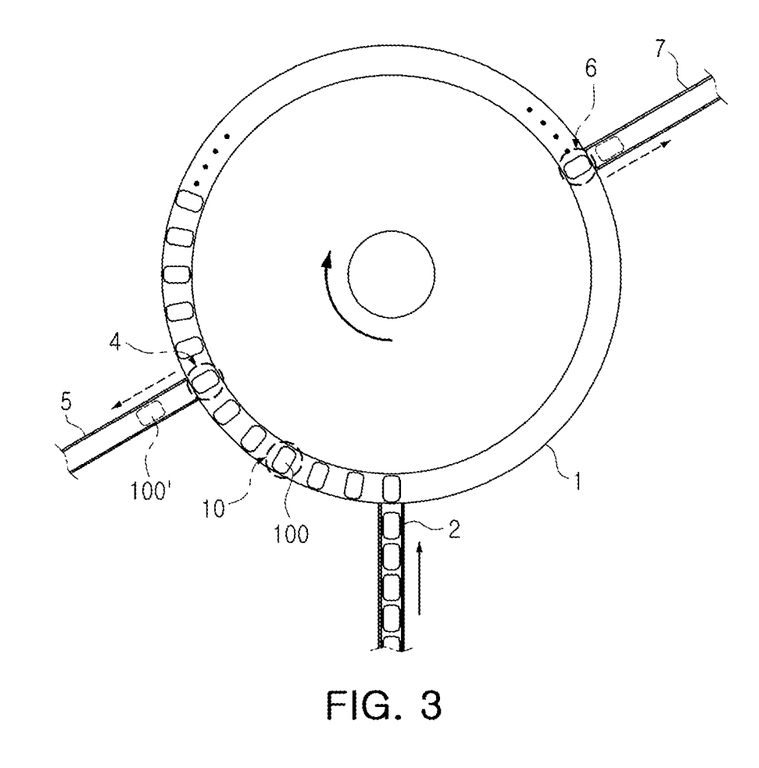
FIG. 3 is a plan view schematically illustrating a detecting apparatus according to an exemplary embodiment in the present disclosure.

FIG. 3 is a plan view schematically illustrating a detecting apparatus according to an exemplary embodiment in the present disclosure.

Figure 4:
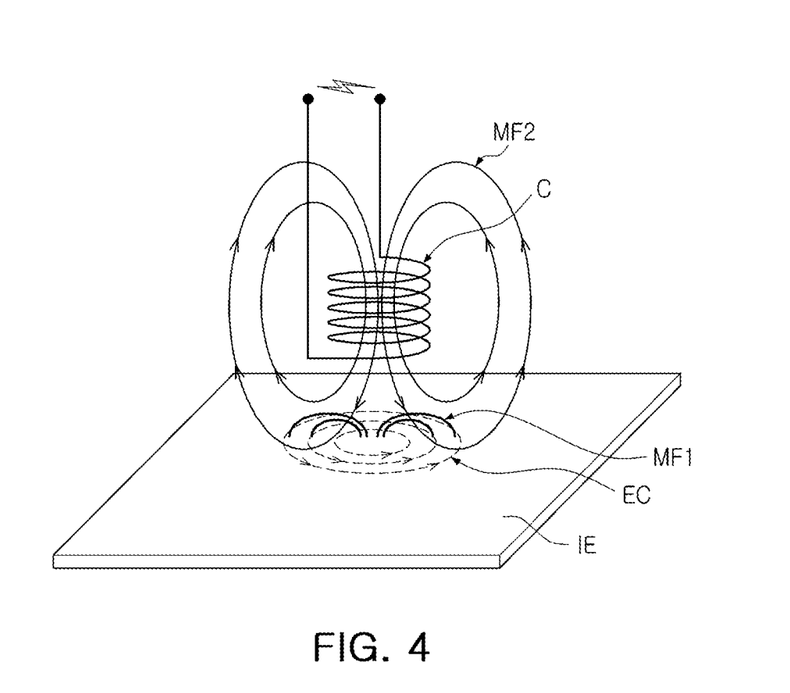
FIG. 4 is a view schematically illustrating an operating principle of a sensor unit in a detecting apparatus according to an exemplary embodiment in the present disclosure.

Referring to FIGS. 3 and 4, the apparatus for detecting a stacking direction of the internal electrodes of the multilayer capacitor according to an exemplary embodiment in the present disclosure includes a capacitor moving unit 1, a sensor unit 10, and a separating unit 5.

The capacitor moving unit 1 has a supply unit 2 in which a plurality of multilayer capacitors 100 are sequentially supplied one by one, and serves to move the supplied multilayer capacitor 100 in one direction. Here, reference numeral 100 denotes the first or second multilayer capacitor before a stacking direction is determined.

The sensor unit 10 includes a coil 11 and is installed on the capacitor moving unit 1.

The sensor unit 10 detects inductance of the coil 11 when each multilayer capacitor 100 approaches, and determines whether a direction in which the internal electrodes of the corresponding multilayer capacitor 100 are stacked is perpendicular or parallel with respect to a mounting surface according to a difference between inductance values of the coil 11.

In this case, if the size of the multilayer capacitor is too small, a change in inductance measured by the sensor unit 10 is small, so that it may be difficult to detect a change in inductance, and thus it may be difficult to determine a multilayer type.

In order to solve this problem, it is advantageous to reduce a size of the coil 11 included in the sensor unit 10.

In this case, an inner diameter of the coil 11 may be 3.0 times or less a length of the multilayer capacitor 100 in the X direction. For example, if the length of the multilayer capacitor 100 in the X direction is 0.6 mm, the inner diameter of the coil 11 may be 1.8 mm or less.

However, if the inner diameter of the coil 11 is small, the generated inductance is reduced. Therefore, it is necessary to increase the number of turns (the number of times the coil is wound) of the coil 11 to realize an appropriate level of inductance.

In this case, the desired number of turns of the coil may be obtained by Equation 1 below.

Number of turns $(N) \geq 20/$(length of multilayer capacitor in $X$ direction×inner diameter of coil). Equation 1)

The separating unit 5 is installed on the capacitor moving unit 2 and serves to separate a multilayer capacitor 100' selected as an unsuitable multilayer capacitor by the sensor unit 10. Here, FIG. 3 illustrates a point where the separating unit 5 is connected to the capacitor moving unit 2.

Further, reference numeral 7 denotes a discharge unit for discharging the multilayer capacitor 100 selected as an appropriate multilayer capacitor 100 by the sensor unit 10, as a product, when the multilayer capacitor 100 selected as the appropriate multilayer capacitor 100 by the sensor unit 10 reaches a position of reference numeral 6.

FIG. 4 is a view schematically illustrating an operating principle of a sensor unit in a detecting apparatus according to an exemplary embodiment in the present disclosure.

A principle of detecting a stacking direction of the internal electrodes of the present disclosure will be described with reference to FIG. 4.

When a plane of a measurement coil and an Ni electrode (IE) (first and second internal electrodes in the present disclosure), which is a conductive material, and are parallel, the magnetic field (MF2) induced from the coil C generates an eddy current EC in the Ni electrode, and the eddy current EC generated in the Ni electrode IE forms an eddy current magnetic field MF1.

The magnetic field MF2 of the coil C is interfered due to the influence of the eddy current magnetic field MF1 generated in this manner, so that the inductance of the coil C is changed, and by measuring the changed inductance, whether the Ni electrode IE is in a parallel or perpendicular state may be detected.

For example, in the case of parallel mounting as illustrated in FIG. 1, the plane of the coil 10 and the first and second internal electrodes 121 and 122 are parallel, which is a condition for easy formation of eddy current, and thus, inductance appears to be significantly reduced.

Conversely, in the case of perpendicular mounting as shown in FIG. 2, since the formation of eddy currents by the first and second electrodes 123 and 124 is small, a decrease in inductance is relatively small compared to that of parallel mounting.

Using the above principle, when a coil through which a current flows is brought close to the multilayer capacitor and a generated inductance value of the coil is measured, whether a stacking direction of the internal electrodes of the multilayer capacitor is parallel or perpendicular with respect to the mounting surface may be distinguished.

In this case, a measurement frequency of the inductance may be preferably 50 kHz to 5 Mhz. If the measurement frequency is lower than 50 kHz, sensitivity of the sensor may be low when measuring the small-sized multilayer capacitor, so the measurement cannot be performed properly. If the measurement frequency is higher than 5 Mhz, the current may flow only to the surface and it may be difficult to measure a change in inductance based on the direction of the internal electrodes of the multilayer capacitor.

Table 1 below shows the measurements of ΔL of the first multilayer capacitor of the parallel stacking type and the second multilayer capacitor of the perpendicular stacking type in multilayer capacitors having lengths, widths, and heights of 2.0 mm, 1.25 mm, and 1.2 mm, respectively.

Here, as for ΔL, an inductance value measured in the coil when there is no multilayer capacitor is defined as Ref, and a difference in inductance value measured in the coil when a current flows in the coil and an eddy current is generated is defined as ΔL.

TABLE 1

| SPL # | ΔL (%) (parallel) | ΔL (%) (perpendicular) |
| --- | --- | --- |
| 1 | −0.5 | +1.2 |
| 2 | −0.5 | +1.1 |
| 3 | −0.4 | +1.1 |
| 4 | −0.5 | +1.2 |
| 5 | −0.6 | +1.2 |
| 6 | −0.5 | +1.3 |
| 7 | −0.5 | +1.1 |
| 8 | −0.4 | +1.2 |
| 9 | −0.6 | +1.2 |
| 10 | −0.5 | +1.2 |

Referring to Table 1, ΔL is negative (−) in the case of the first multilayer capacitor, and ΔL is positive (+) in the case of the second multilayer capacitor, indicating that the stacking direction of the internal electrodes of the multilayer capacitor is distinguished through a change in inductance.

Table 2 shows the measurements of ΔL of the first and second multilayer capacitors in the multilayer capacitors having length, width, and height of 1.6 mm, 0.8 mm, and 0.8 mm.

| SPL # | ΔL (%) (parallel) | ΔL (%) (perpendicular) |
| --- | --- | --- |
| 11 | −0.3 | +0.8 |
| 12 | −0.3 | +0.8 |

-continued

| SPL # | ΔL (%) (parallel) | ΔL (%) (perpendicular) |
|---|---|---|
| 13 | −0.2 | +0.8 |
| 14 | −0.3 | +0.9 |
| 15 | −0.4 | +0.9 |
| 16 | −0.3 | +0.9 |
| 17 | −0.4 | +0.8 |
| 18 | −0.3 | +0.9 |
| 19 | −0.3 | +0.9 |
| 20 | −0.3 | +0.8 |

Referring to Table 2, ΔL is negative (−) in the case of the first multilayer capacitor, and ΔL is positive (+) in the case of the second multilayer capacitor, indicating that a stacking direction of the internal electrodes of the multilayer capacitor may be distinguished through the change in inductance.

Table 3 shows the measurements of ΔL of the first and second multilayer capacitors in the multilayer capacitors having lengths, widths and heights of 1.0 mm, 0.5 mm, and 0.5 mm.

TABLE 3

| SPL # | ΔL (%) (parallel) | ΔL (%) (perpendicular) |
|---|---|---|
| 21 | −0.2 | +0.6 |
| 22 | −0.2 | +0.6 |
| 23 | −0.1 | +0.7 |
| 24 | −0.2 | +0.6 |
| 25 | −0.2 | +0.6 |
| 26 | −0.2 | +0.5 |
| 27 | −0.3 | +0.6 |
| 28 | −0.2 | +0.6 |
| 29 | −0.2 | +0.6 |
| 30 | −0.2 | +0.7 |

Referring to Table 3, ΔL is negative (−) in the case of the first multilayer capacitor, and ΔL is positive (+) in the case of the second multilayer capacitor, indicating that the stacking direction of the internal electrodes of the multilayer capacitor may be distinguished through a change in inductance.

Table 4 shows the measurements of ΔL of the first and second multilayer capacitors in the multilayer capacitors having lengths, widths, and heights of 0.6 mm, 0.3 mm, and 0.3 mm.

TABLE 4

| SPL # | ΔL (%) (parallel) | ΔL (%) (perpendicular) |
|---|---|---|
| 31 | −0.1 | +0.3 |
| 32 | −0.1 | +0.3 |
| 33 | −0.1 | +0.4 |
| 34 | −0.1 | +0.4 |
| 35 | −0.1 | +0.3 |
| 36 | −0.1 | +0.3 |
| 37 | −0.1 | +0.3 |
| 38 | −0.1 | +0.4 |
| 39 | −0.1 | +0.3 |
| 40 | −0.1 | +0.3 |

Referring to Table 4, ΔL is negative (−) for the first multilayer capacitor, and ΔL is positive (+) for the second multilayer capacitor, indicating that the stacking direction of the internal electrodes of the multilayer capacitor is distinguished through a change in inductance.

According to an exemplary embodiment in the present disclosure, by detecting the stacking direction of the internal electrodes of the multilayer capacitor using the eddy current generated in the coil, there is little influence on the appearance or shape of the product, a measurement speed is fast, and a high repetitive reproducibility may be expected. Here, high repetitive reproducibility means that there is little variation in measurement values when the same product is repeatedly measured several times.

In addition, as can be seen in Tables 1 to 4, it is applicable to all multilayer capacitors using a metal electrode inside the capacitor body, and the ΔL difference in the parallel/perpendicular direction may be made to be large by changing a size of the coil and a current flowing through the coil, which may further improve detection power.

A method of detecting a stacking direction of the internal electrodes of the multilayer capacitor according to the present disclosure using the detecting apparatus configured as described above will be described in detail.

According to an exemplary embodiment in the present disclosure, an inductance value of the coil according to a stacking direction of the internal electrodes included in the multilayer capacitor is determined by positioning the sensor unit including the coil to be close to the multilayer capacitor, and the determined inductance value may be compared with a preset reference inductance value to determine a difference in inductance value of the coil, so as to detect the stacking direction of the internal electrodes of the multilayer capacitor.

Figure 5:
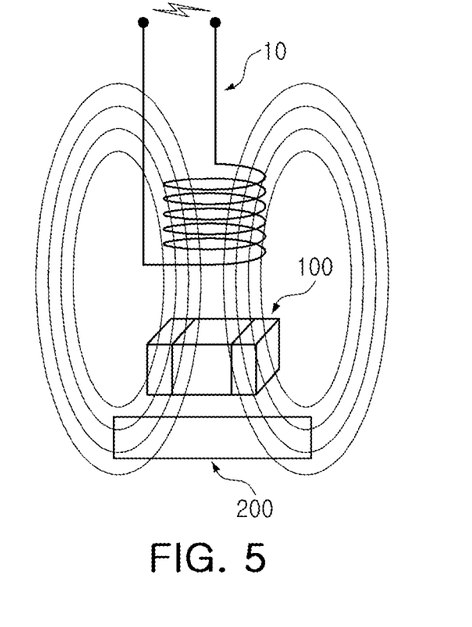
FIG. 5 is a view schematically illustrating a method of detecting a stacking direction of internal electrodes according to another exemplary embodiment in the present disclosure.

FIG. 5 is a diagram schematically illustrating a method of detecting a stacking direction of internal electrodes according to another exemplary embodiment in the present disclosure.

Referring to FIG. 5, in order to increase sensitivity of an inductance change of the sensor unit 10, a magnetic member 200 may be disposed in a position opposite to the coil of the sensor unit 10 with the multilayer capacitor 100 interposed therebetween.

In this case, the magnetic member 200 may preferably be formed of a material having high magnetic permeability, for example, iron (Fe), etc., and the magnetic permeability of the magnetic member 200 may range preferably from 100 to 5000.

When the magnetic member 200 formed of a material having high magnetic permeability is positioned on the opposite side of the sensor unit 10, a magnetic field generated in the coil of the sensor unit 10 is prevented from being dispersed, and is collected toward the magnetic member 200, and thus, sensitivity of the sensor unit 10 may be increased by increasing a change in inductance of the coil caused by an eddy current.

In this case, a size of the magnetic member 200 may be effective when it is 100 to 400% of the size of the multilayer capacitor 100 to be measured. Preferably, a best result may be obtained when the size of the magnetic member 200 is 100 to 200% of the size of the multilayer capacitor 100 to be measured.

Figure 6A:
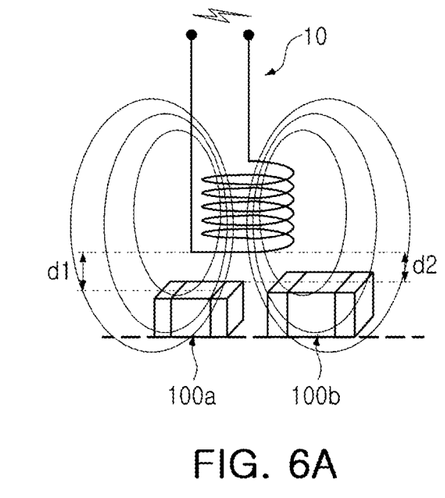
FIGS. 6A and 6B are views schematically illustrating a method of detecting a stacking direction of internal electrodes according to another exemplary embodiment in the present disclosure.
Figure 6B:
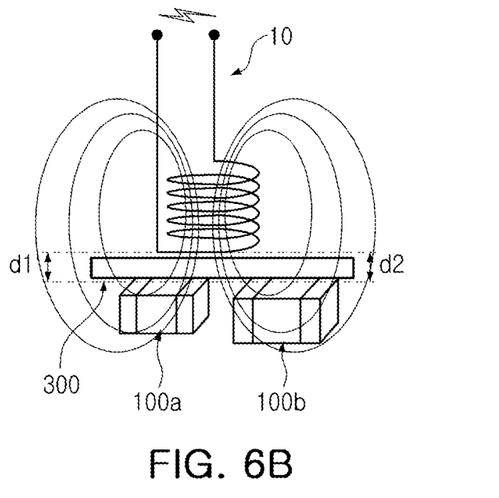

FIGS. 6A and 6B are diagrams schematically illustrating a method of detecting a stacking direction of internal electrodes according to another exemplary embodiment in the present disclosure.

In the sensor unit 10 according to an exemplary embodiment, a measured inductance value may change according to a change in a measurement distance.

Referring to FIG. 6A, for example, there may be a slight difference in size even for the multilayer capacitors 100a and 100b of the same standard. In this case, when the distances d1 and d2 between the sensor unit 10 and the multilayer capacitor are different, an error occurs in a measured inductance value, and thus, it may be difficult to accurately distinguish whether the stacking direction of the internal electrodes of the multilayer capacitors 100a and 100b is perpendicular or parallel.

Referring to FIG. 6B, in an exemplary embodiment in the present disclosure, an interval maintaining member 300 may be disposed between the sensor unit 10 and the multilayer capacitors 100a and 100b having a size deviation.

The interval maintaining member 300 is in close contact with one surface of the multilayer capacitors 100a and 100b so that distances d1' and d2 between the sensor unit 10 and the multilayer capacitors 100a and 100b are constantly maintained. Accordingly, even if there is a size distribution between the multilayer capacitors 100a and 100b, the inductance values may be measured stably.

In this case, the interval maintaining member 300 may be formed of a non-magnetic material that is not conductive, for example, a PET film, glass, or the like.

Meanwhile, the sensor unit according to an exemplary embodiment in the present disclosure may also be disposed below the capacitor moving unit.

In this case, since the multilayer capacitors are supported on a support surface of the capacitor moving unit and the sensor unit is located below the support surface, the interval between the multilayer capacitors and the sensor unit may be maintained to be constant even if there is a size deviation between the multilayer capacitors.

As set forth above, according to an exemplary embodiment in the present disclosure, in order to detect a direction of the internal electrodes included in a multilayer capacitor, a coil is used to detect a difference in inductance of the coil according to a stacking direction (parallel/perpendicular) of the internal electrodes inside the capacitor body, thereby simply and accurately detecting an alignment state of the internal electrode direction of the multilayer capacitor.

While exemplary embodiments have been shown and described above, it will be apparent to those skilled in the art that modifications and variations could be made without departing from the scope of the present disclosure as defined by the appended claims.

What is claimed is:

1. An apparatus for detecting a stacking direction of internal electrodes of a multilayer capacitor, the apparatus comprising:
a capacitor moving unit having a supply unit in which a plurality of multilayer capacitors are continuously supplied and moving the supplied multilayer capacitors in one direction;
a sensor unit including a coil, installed on the capacitor moving unit, and configured to detect inductance of the coil when each of the multilayer capacitors approaches the coil and to determine a stacking direction of internal electrodes of the corresponding multilayer capacitor based on the detected inductance of the coil; and
a separating unit installed on the capacitor moving unit and configured to separate a multilayer capacitor selected as an unsuitable multilayer capacitor by the sensor unit.

2. The apparatus of claim 1, further comprising:
a magnetic member disposed in a position opposing the sensor unit with the corresponding multilayer capacitor interposed therebetween.

3. The apparatus of claim 2, wherein
a magnetic permeability of the magnetic member ranges from 100 to 5000.

4. The apparatus of claim 1, further comprising:
an interval maintaining member disposed between the sensor unit and the corresponding multilayer capacitor and disposed to be in contact with one surface of the multilayer capacitor, wherein an interval between the sensor unit and the multilayer capacitor is uniform.

5. The apparatus of claim 4, wherein
the interval maintaining member includes a non-magnetic material.

6. The apparatus of claim 1, wherein,
in the sensor unit, an inner diameter of the coil is 3.0 times or less of a length of the corresponding multilayer capacitor in a length direction, and the number of turns of the coil satisfies Equation 1 below:

the number of turns $(N) \geq 20/$(length of multilayer capacitor×inner diameter of coil). [Equation 1]

7. The apparatus of claim 1, wherein the sensor unit determines the stacking direction of the internal electrodes of the corresponding multilayer capacitor by comparing an inductance value of the coil to a preset reference inductance value, which is defined as an inductance value measured in the coil when there is no multilayer capacitor, and determining a difference ($\Delta L$) between the inductance value of the coil and the preset reference inductance value.

8. A method for detecting a stacking direction of internal electrodes of a multilayer capacitor, the method comprising:
allowing a sensor unit including a coil to approach a multilayer capacitor to determine an inductance value of the coil according to a stacking direction of the internal electrodes included in the multilayer capacitor and comparing the determined inductance value with a preset reference inductance value to detect the stacking direction of the internal electrodes of the multilayer capacitor.

9. The method of claim 8, wherein
a measurement frequency of inductance ranges from 50 kHz to 5 Mhz.

10. The method of claim 8, wherein
a magnetic member is disposed in a position opposing the sensor unit with the multilayer capacitor interposed therebetween to increase a change in inductance of the coil generated by an eddy current.

11. The method of claim 10, wherein
a magnetic permeability of the magnetic member ranges from 100 to 5000.

12. The method of claim 8, wherein
an interval maintaining member including a non-magnetic material is disposed between the sensor unit and the multilayer capacitor, and is disposed to be in contact with one surface of the multilayer capacitor so that an interval between the sensor unit and the multilayer capacitor is uniformly maintained.

13. The method of claim 8, wherein the allowing a sensor unit including a coil to approach a multilayer capacitor to determine an inductance value of the coil comprises
determining the stacking direction of the internal electrodes of the multilayer capacitor by determining a difference ($\Delta L$) between the inductance value of the coil and the preset reference inductance value, which is defined as an inductance value measured in the coil when there is no multilayer capacitor.

* * * * *